(12) United States Patent
De La Bardonnie

(10) Patent No.: US 10,840,945 B2
(45) Date of Patent: Nov. 17, 2020

(54) DEVICE FOR ENCODING INFORMATION BETWEEN A PLURALITY OF SWITCHES OF AN OPERATING LEVER AND A CONTROL DEVICE

(71) Applicant: RATIER-FIGEAC, Figeac (FR)

(72) Inventor: Jean De La Bardonnie, Vindelle (FR)

(73) Assignee: RATIER-FIGEAC, Figeac (FR)

( * ) Notice: Subject to any disclaimer, the term of this patent is extended or adjusted under 35 U.S.C. 154(b) by 0 days.

(21) Appl. No.: 16/349,510

(22) PCT Filed: Nov. 13, 2017

(86) PCT No.: PCT/EP2017/079017
§ 371 (c)(1),
(2) Date: May 13, 2019

(87) PCT Pub. No.: WO2018/087353
PCT Pub. Date: May 17, 2018

(65) Prior Publication Data
US 2019/0341931 A1 Nov. 7, 2019

(30) Foreign Application Priority Data

Nov. 14, 2016 (FR) ..................................... 16 60980

(51) Int. Cl.
| | | |
|---|---|---|
| *H03M 11/24* | (2006.01) | |
| *B64C 13/04* | (2006.01) | |
| *B64C 27/56* | (2006.01) | |
| *G05G 9/047* | (2006.01) | |

(Continued)

(52) U.S. Cl.
CPC ......... *H03M 11/24* (2013.01); *B64C 13/0421* (2018.01); *B64C 27/56* (2013.01); *G05G 9/047* (2013.01); *H03M 1/765* (2013.01); *H03M 1/785* (2013.01); *G05G 2009/04744* (2013.01)

(58) Field of Classification Search
None
See application file for complete search history.

(56) References Cited

U.S. PATENT DOCUMENTS

| | | | | |
|---|---|---|---|---|
| 3,882,484 A | * | 5/1975 | Brokaw | ........... H03M 1/40 341/127 |
| 4,015,254 A | | 3/1977 | Strandt | |
| 7,265,699 B1 | | 9/2007 | Johnson et al. | |

(Continued)

FOREIGN PATENT DOCUMENTS

| | | |
|---|---|---|
| FR | 2604045 | 3/1988 |
| GB | 2303723 | 2/1997 |

OTHER PUBLICATIONS

International Search Report dated Jan. 26, 2018.
International Search Report dated Jun. 28, 2018.

*Primary Examiner* — Carlos Garcia
(74) *Attorney, Agent, or Firm* — IPSILON USA, LLP

(57) ABSTRACT

The invention relates to a device (1) for encoding information between a plurality of normally closed switches (P1 . . . Pn) arranged on an operating lever (2) and a control device (9), said switches being connected in series between a voltage line (3) and a measuring line (5), each switch (Pi) being associated with a single resistor (Ri) connected between the terminal of the switch closest to a voltage source (Vcc) and the measuring line. The encoding device thus allows a hierarchy of the switches to be obtained.

12 Claims, 2 Drawing Sheets

(51) Int. Cl.
    *H03M 1/76*     (2006.01)
    *H03M 1/78*     (2006.01)

(56) References Cited

U.S. PATENT DOCUMENTS

2011/0102022 A1    5/2011   Lee
2017/0264190 A1*  9/2017   Unno ..................... H02M 3/04

* cited by examiner

DEVICE FOR ENCODING INFORMATION BETWEEN A PLURALITY OF SWITCHES OF AN OPERATING LEVER AND A CONTROL DEVICE

RELATED APPLICATION

This application is a National Phase of PCT/EP2017/079017 filed on Nov. 13, 2017, which claims the benefit of priority from French Patent Application Nos. 16 60980, filed on Nov. 14, 2016, the entirety of which are incorporated by reference.

FIELD OF THE INVENTION

The invention relates to a device for encoding information, more particularly an encoding device relating to the state of control switches with normally closed contacts, arranged on an operating lever such as a steering wheel or an aircraft joystick and a control device, for example a flight control computer of an aircraft. The invention is directed more particularly to a helicopter joystick.

DESCRIPTION OF RELATED ART

The transmission of the state of a plurality of switches (bistable or push-button or the like) on an operating lever which is movable relative to a frame, e.g., an automobile steering wheel or an aircraft joystick, towards a control device which is fixed relative to this frame, has always been a problem whether in the aeronautical sector, the automotive sector, or any other sector. In fact, if it is desired to detect the state of n switches independently of each other, there should be a minimum of n+1 conductive wires connecting the movable lever to the control device. Such a number of conductive wires—all the more if these wires must be doubled for reasons of reliability—limits the freedom of movement of the lever which is movable by a spring effect, and presents a problem in terms of passing cables at the articulation(s) of the movable lever with the frame supporting the control device which is fixed relative to the frame.

Various solutions, particularly those using digital electronic multiplexing, have been envisaged but have proven to be unreliable in an environment heavily disrupted by electromagnetic radiation, e.g., lightning, radiation from other apparatuses (radars, etc.) as found in aircraft cockpits.

Analog solutions, based on arrays of resistors connected to switches, have thus been envisaged. U.S. Pat. No. 4,471,234 discloses for example the use of an array of normally closed switches connected in series between a constant current supply line and a reference line (ground), each switch having in parallel a resistor of predetermined value. The voltage prevailing on the supply line is drawn from a measuring line and allows the state of the switches to be identified. Thus, when no switch is open, the resistors are in short-circuit and the voltage measured on the measuring line is zero. As soon as a switch is open, the voltage taken on the measuring line is equal to the product of the value of the resistor in parallel with this switch and the current passing through the circuit. However, this circuit requires a current generator which is precise and able to support a permanent short-circuit when all the switches are closed. Moreover, when several switches are open, the measured voltage is representative of the sum of the in-parallel resistors of the switches in question. If the number of switches of the circuit is high, identification of the actuated switches becomes difficult. It is, furthermore, very difficult to recognize an action on an override switch since the variation range of the measured voltage for this switch is disrupted by the other switches which may be actuated at the same time.

OBJECT AND SUMMARY

The invention thus aims to provide a device for encoding information between a plurality of normally closed switches and a control device allowing the priorities between the switches to be defined.

The invention likewise aims to provide such a device avoiding confusion when several switches are actuated at the same time.

The invention further aims to provide such a device which is simple to implement, particularly when the switches are located remotely from the control device.

To this end, the invention relates to a device for encoding information between a plurality of normally closed switches arranged on an operating lever and a control device, said device comprising:

a voltage line connected to a positive terminal of a voltage source, a reference line connected to ground of the voltage source, a measuring line connected to the control device, a plurality of switches connected in series to the voltage line, each switch being associated with a single resistor and connected by a first terminal to a first terminal of said resistor at a common point, named priority node, characterized in that:

each priority node is arranged on the first terminal of the switch closest to the voltage line, named upstream terminal of the switch, a second terminal of each resistor is connected to the measuring line, the measuring line is connected to the reference line by an additional resistor, named bottom resistor.

In the present text, a rank is defined for a switch of a plurality of switches in series to define the relative position of this switch in the series. The lowest rank is given to the switch closest to the voltage source and increases as a function of the distance of a switch to this voltage source. A node is likewise defined at the connection point of the terminal of a switch closest to the voltage source and a resistor, the resistor and the node being given the same rank as the switch connected to this node. Thus, the node of rank i is arranged between the switch of rank i and the switch of rank i−1 and the resistor of rank i is connected to the node of rank i. In order to simplify the description, the terms "upstream" and "downstream" as well as any derivatives will be able to be used to determine a relative position of two elements with respect to terminals of the voltage source. Therefore, the terminal of a switch closest to the positive terminal of the voltage source is the upstream terminal of this switch. Similarly, a switch with a rank higher than another switch is placed downstream of this other switch, i.e., closer to ground of the voltage source.

More particularly, the second terminal of each resistor is connected to the reference line via said bottom resistor. Furthermore, advantageously, the switch with the highest rank comprises a second terminal connected to the reference line via said bottom resistor.

Owing to this arrangement, any switch which is actuated and thus open, cuts the circuit allowing the supply of power to the switches located downstream of its position. Consequently, the actions performed on the switches which a rank higher than an actuated switch no longer have an effect on the voltage value measured on the measuring line. Therefore, a priority is defined between the switches, a switch with a given rank having priority over a switch with a higher rank.

In some preferred embodiments in accordance with the invention, the switch furthest away from the voltage line is connected by a second terminal to the measuring line. In this manner, when none of the switches are actuated, the measuring line is connected directly to the voltage line and the value measured on the measuring line is equal to the supply voltage of the device.

In accordance with a variant of these preferred embodiments, the priority node closest to the voltage line is connected thereto via an additional resistor, named top resistor. Owing to this top resistor, when no switch is actuated, the voltage measured on the measuring line is determined by the ratio of the bridge formed by the top resistor and the bottom resistor. Consequently, it is possible to differentiate the case where no switch is actuated from a short-circuit of the measuring line to the voltage line. The reliability of the encoding device is thus improved thereby.

In some advantageous embodiments in accordance with the invention, this comprises an alternative measuring line connected to the priority node closest to the voltage line. Owing to this alternative measuring line, it is possible to obtain two separate and redundant measurements of the state of the switches and to improve the reliability of the device.

In some advantageous embodiments in accordance with the invention, this is at least partially arranged within the operating lever. Consequently, the different resistors of the device are as close as possible to the switches on the operating lever and this is connected to its fixed base only by three wires corresponding to the voltage line, measuring line and reference line.

In some advantageous embodiments in accordance with the invention, the bottom resistor directly connected to the reference line and the top resistor directly connected to the voltage line are arranged outside of the operating lever and allow proper operation of the encoding device to be verified. Consequently, two connecting wires between the operating lever and an external board, for example forming part of the control device, supporting the top resistor and the bottom resistor are sufficient to carry the different information regarding the state of the switches. Furthermore, in this manner, the top resistor allows the current to be limited in the case where the connecting wire between the top resistor and the operating lever is short-circuited to ground or even when the measuring line is short-circuited to ground and no switch is actuated.

In some advantageous embodiments in accordance with the invention, each switch comprises at least two pairs of contacts, a first, normally closed, pair and a second, normally open, pair, the different pairs of contacts changing state at the same time. By way of a complementary arrangement of the encoding device, this allows redundancy of the provided encoding information to be obtained.

In some advantageous embodiments in accordance with the invention, the encoding device comprises at least one complementary arrangement comprising an array of resistors in series between a second voltage line connected to a positive terminal of a voltage source and a plurality of pairs of normally open contacts, each pair of contacts comprising an upstream terminal and a downstream terminal, the upstream terminal of each pair of contacts being connected respectively to a connection point between two consecutive resistors and the downstream terminal being connected to a second reference line connected to ground of a voltage source. Owing to this/these complementary arrangement(s), it is possible to obtain redundant information regarding the state of the switches, using in particular separate hardware, and an encoding device having improved reliability.

In particular, the array of resistors of at least one complementary arrangement has a first end connected to the second voltage line and a second end connected to the second reference line. Furthermore, this array of resistors is connected to a second measuring line. Preferably, the second end of this array of resistors is connected to the second measuring line.

Advantageously, the downstream terminal of each pair of normally open contacts is connected to ground of the voltage source via a resistor, named complementary bottom resistor. Nevertheless, there is nothing to prevent the downstream terminal of each pair of normally open contacts being connected directly to ground of the voltage source, the voltage being measured on a second alternative measuring line connected to the priority node closest to said voltage line of this complementary arrangement.

More particularly, in some of these embodiments, the encoding device comprises at least one complementary arrangement comprising an array of resistors in series between a second voltage line and a plurality of pairs of normally open contacts, each pair of contacts comprising an upstream terminal and a downstream terminal, the upstream terminal of each pair of contacts being connected respectively to a connection point between two consecutive resistors and the downstream terminal being connected to a second measuring line. Therefore, the downstream terminal of each pair of contacts is connected to the second measuring line and to ground of the voltage source.

As a variant, the downstream terminal of each pair of contacts can be connected only to ground of the voltage source.

In some advantageous embodiments in accordance with the invention, the complementary arrangement likewise comprises an alternative measuring line connected to a downstream terminal of a first resistor of said array of resistors, an upstream terminal of which is directly connected to the second voltage line. The complementary arrangement thus comprises said second measuring line and said alternative measuring line. It is thus possible to have two measuring points for a single arrangement.

In some advantageous embodiments in accordance with the invention, the complementary arrangement comprises an additional resistor connected between the upstream terminal of the pair of contacts with the highest rank and the measuring line. Owing to this additional resistor, it is possible to distinguish a state of normal operation, where no switch is actuated, from a fault due to a break in a power supply wire.

The invention likewise relates to an operating lever which is movable relative to a frame and connected to a control device, characterized in that it comprises an encoding device having any one of the features mentioned above.

In some advantageous embodiments in accordance with the invention, the operating lever forms a joystick of an aircraft, in particular a helicopter. In this type of joystick, the device in accordance with the invention allows, in the case of several buttons being inadvertently pressed at the same time, as can occur in an emergency situation, the use of the hierarchy of priorities between buttons to prioritize the most important action to be performed.

The invention likewise relates to an encoding device and an operating lever which are characterized in combination or individually by all or some of the features mentioned above or below. However they are formally presented, unless explicitly stated otherwise, the different features mentioned above or below should not be considered to be closely or inextricably linked with each other, the invention being able to relate to only one of these structural or functional features, or only some of these structural or functional features, or only part of one of these structural or functional features, or even any group, combination or juxtaposition of all or some of these structural or functional features.

BRIEF DESCRIPTION OF THE DRAWINGS

Other aims, features and advantages of the invention will become apparent in view of the following description and the accompanying drawings, in which.

DETAILED DESCRIPTION

Figure 1:
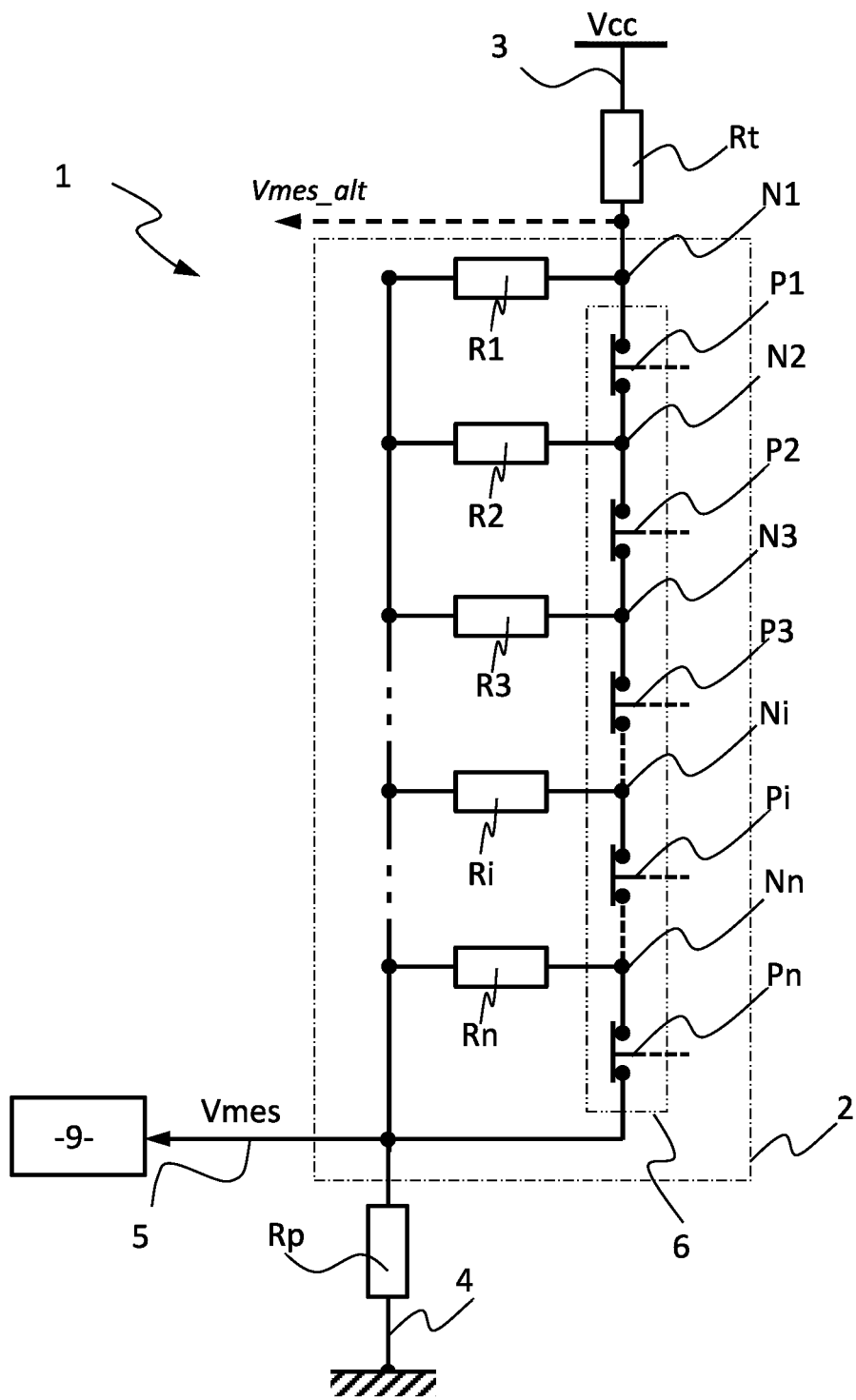
FIG. 1 illustrates a first diagram of an encoding device in accordance with the invention, allowing a hierarchy of priorities between the switches to be seen.

FIG. 1 illustrates a wiring diagram of an encoding device 1 in accordance with the invention. The device 1 comprises a plurality 6 of normally closed switches P1 to Pn arranged in series and connected by a terminal of the switch with the lowest rank P1 to a positive terminal Vcc of a voltage source via a top resistor Rt and a voltage line 3. In FIG. 1, the switches have been shown symbolically in the form of push-buttons with normally closed contacts, i.e., the terminals of the switches are short-circuited whilst the switches are not actuated and pass to open circuit when the switch is actuated.

For each switch P1 to Pn, a resistor R1 to Rn is connected by one of its terminals to the upstream terminal (i.e., the terminal closest to the voltage source Vcc) of the switch. Each connection point between a resistor and a switch defines a node, named priority node N1 to Nn. The opposite terminal of each resistor R1 to Rn is connected to a measuring line 5, itself connected to ground of the voltage source by a bottom resistor Rp and a reference line 4.

In a preferred embodiment of the encoding device 1, the downstream terminal of the switch with the highest rank Pn is likewise connected to the measuring line 5.

In accordance with an advantageous feature, the encoding device 1 is essentially contained within an operating lever 2 shown in FIG. 1 by a box with dot-dash lines. Only the top resistor Rt and bottom resistor Rp can be placed outside of the operating lever 2 in order for proper operation of the encoding device to be verified, as shown hereinafter.

Operation of the encoding device is as follows: when none of the switches are actuated, all the switches are short-circuited.

In a non-preferred embodiment of the device, if the top resistor Rt is not present or has a value of zero, and if the downstream terminal of the switch with the highest rank Pn is not connected to the measuring line 5, the voltage across all the priority nodes N1 to Nn is equal to the voltage of the current source Vcc. The resistors R1 to Rn are thus arranged in parallel and the voltage Vmes measured on the measuring line 5 when none of the switches are actuated is equal to:

$$Vmes = Vcc \times \frac{Rp}{R(R1 \| Rn) + Rp}$$

where $R(R1 \| Rn)$ is the resistor equivalent to the resistors R1 to Rn in parallel. If the resistor Rt is present and has a non-zero value, its value is added to the denominator of the above equation.

Advantageously, in a preferred embodiment of the encoding device the downstream terminal of the switch with the highest rank is connected to the measuring line 5, which allows its potential to be fixed relative to ground. Consequently, if no switch is actuated the measured voltage Vmes is equal to:

$$Vmes = Vcc \times \frac{Rp}{Rt + Rp}$$

Therefore, by choosing a top resistor Rt with a non-zero value, it is possible to differentiate the case where no switch is actuated (open) from the case where the measuring line would be short-circuited with the voltage source. The encoding device is thus rendered more reliable.

When a switch Pi is actuated, the power supply circuit of the resistors Ri+1 to Rn is interrupted and only the resistors R1 to Ri are supplied with power. In this case, the circuit comprises the top resistor Rt in series with a resistor equivalent to the resistors R1 to Ri in parallel, the measuring point of the voltage Vmes and the bottom resistor Rp to ground.

Consequently, the general equation of the measured voltage value is given, for an actuated switch Pi, as:

$$Vmes = Vcc \times \frac{Rp}{Rp + Rt + \left(\sum_{j=1}^{i} \frac{1}{Rj}\right)^{-1}}$$

where $$\left(\sum_{j=1}^{i} \frac{1}{Rj}\right)^{-1}$$

is the resistor equivalent to the resistors R1 to Ri in parallel.

It will likewise be noted that when a switch Pi is open, the state of the switches with a higher rank, i.e., switches Pi+1 to Pn, is not important and has no effect on the measured voltage. In fact, in this case, the priority nodes from Ni+1 are no longer supplied with power, the resistors Ri+1 to Rn no longer have current passing through them and thus no longer contribute to the measured voltage Vmes.

A priority order has thus been defined: when two or more of the switches are actuated at the same time, the measured voltage corresponds to the open switch with the lowest rank, this switch hiding the state of any switch with a higher rank.

By way of example, for an encoding device capable of encoding eight switches, eight switches in series P1 to P8 are used, to which eight resistors R1 to R8 are connected. A top resistor Rt is arranged between the voltage line 3 and the priority node N1 and a bottom resistor Rp is arranged between the measuring line 5 and the reference line 4. The downstream terminal of the switch P8 is likewise connected to the measuring line 5. The values of these resistors are calculated in order, on the one hand, to ensure a current level sufficient not to be disrupted by the variety of electromagnetic interference which can occur in a helicopter cockpit for example, and, on the other hand, to provide a sufficient level of discrimination between the different switches. By judiciously choosing the resistors, for a voltage Vcc of 10 V, a bottom resistor of 9 kΩ and a top resistor of 1 kΩ, measurements are obtained as shown in the table below:

| Resistors | Value (kΩ) * | Open switch | Vmes/Vcc * |
|---|---|---|---|
| R1 | 80 | P1 | 10% |
| R2 | 62 | P2 | 20% |
| R3 | 47 | P3 | 30% |
| R4 | 33 | P4 | 40% |
| R5 | 22 | P5 | 50% |
| R6 | 13 | P6 | 60% |
| R7 | 7 | P7 | 70% |
| R8 | 2 | P8 | 80% |
|   |   | None | 90% |

* Rounded approximate value

It can thus be seen that the ratio of the measured voltage to the power supply voltage has steps in the order of 10% allowing an error-free determination to be made as to which is the actuated switch. Furthermore, the measured voltage when no switch is actuated is sufficiently different from the power supply voltage to allow a distinction to be made between cases of a fault such as a break in the reference line or a short-circuit in the power supply line to the measuring line.

Figure 2:
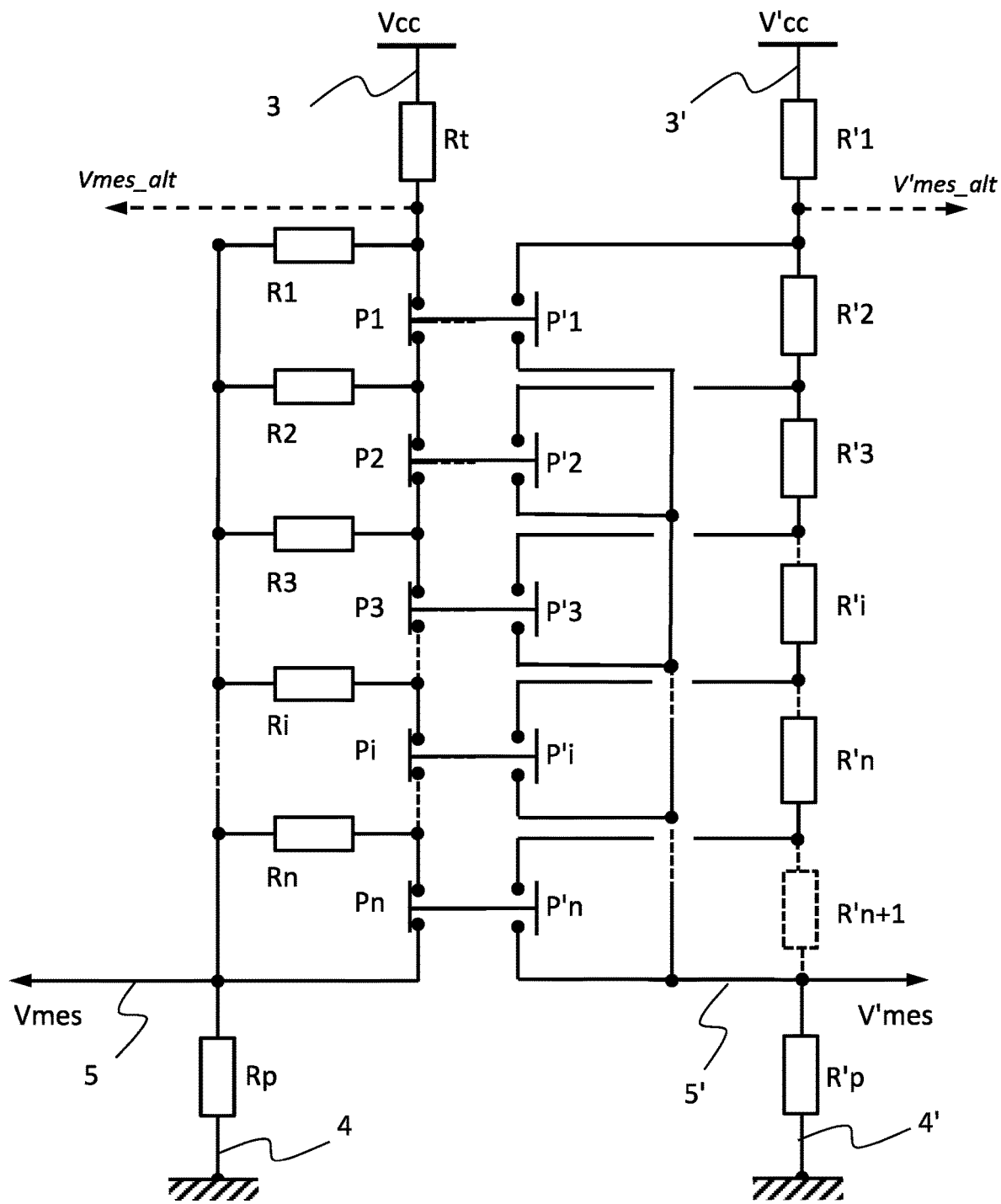
FIG. 2 illustrates a diagram of an encoding device in accordance with the invention using switches having two pairs of contacts of opposing types (normally open and normally closed) and an arrangement allowing information redundancy.

Reference is now made to FIG. 2 of the drawing which illustrates an arrangement which benefits from an advantageous feature of the switches used. In fact, each switch comprises at least two pairs of contacts, a first pair, named normally closed pair, in which the two terminals are connected in short-circuit when the switch or the push-button is not actuated and a second pair of contacts, named normally open pair, in which the two terminals are in open circuit whilst the switch or push-button is not actuated. It should be noted that the first and second pairs of contacts change state at the same time when the switch or the push-button is actuated.

In FIG. 2, each switch is designated by two references, a first reference Pi representing the pair of normally closed contacts of the switch of rank i and a second reference P'i representing the pair of normally open contacts of this same switch of rank i.

As seen in relation to FIG. 1, the left-hand part of FIG. 2 shows an arrangement of normally closed contacts P1 ... Pi ... Pn mounted in series between a top resistor Rt connected to a voltage line 3 and a measuring line 5. Resistors R1 ... Ri ... Rn are mounted in parallel between an upstream contact of the switch of the same rank and the measuring line 5. The measuring line 5 is connected to the reference line 4 by a bottom resistor Rp. The operation of this part of the arrangement is identical to that described in relation to FIG. 1: when a switch Pi is open, current passes through the resistors R1 to Ri and through the bottom resistor Rp. The voltage Vmes measured on the measuring line 5 is thus equal to:

$$Vmes = Vcc \times \frac{Rp}{Rp + Rt + \left(\sum_{j=1}^{i} \frac{1}{Rj}\right)^{-1}}$$

Similarly, when a switch Pi is open, the state of the switches with a higher rank, i.e. switches Pi+1 to Pn, is not important and has no effect on the measured voltage. In fact, in this case none of the resistors with a rank higher than Ri is supplied with power.

The right-hand part of the arrangement illustrated in FIG. 2 likewise shows a second voltage line 3' and a second reference line 4' which may or may not be connected to the same potential as the voltage line 3 and reference line 4 serving the left-hand part of the arrangement. An array of resistors R'1 ... R'i ... R'n is arranged in series between the voltage line 3' and the measuring line 5'. The measuring line 5' is connected to the reference line 4' by a bottom resistor R'p. Each connection point between two consecutive resistors is connected to the upstream terminal of a pair of normally open contacts P'1 ... P'i ... P'n, the downstream terminal of this pair of contacts being connected to the measuring line 5'.

The operation of the right-hand part of the arrangement of the encoding device of FIG. 2 is as follows. When a pair of contacts P'i is closed, current passes through the resistors R'1 to R'i and through the bottom resistor R'p mounted in series. Consequently, the voltage V'mes measured on the measuring line 5' is thus equal to:

$$V'mes = V'cc \times \frac{R'p}{R'p + \sum_{j=1}^{i} R'j}$$

In an advantageous variant of this part of the arrangement, it is possible to connect a resistor $R'_{n+1}$ between the upstream terminal of the pair of contacts P'n with the highest rank and the measuring line 5'. Owing to this additional resistor, a current is established between the voltage line 3' and the measuring line 5' even when all the pairs of contacts are open, which allows a distinction to be made between this case and the case where a connecting wire is cut (e.g., between V'cc and R'1 or between the measuring line and ground) so as to improve the reliability of the device. Thus, when none of the pairs of contacts P'i are closed, the voltage V'mes measured on the measuring line 5' is equal to:

$$V'mes = V'cc \times \frac{R'p}{R'p + R'_{n+1}}$$

It will likewise be noted that when a pair of contacts P'i is closed, the state of the pairs of contacts with a higher rank, i.e., pairs of contacts P'i+1 to P'n, is not important and has no effect on the measured voltage. In fact, in this case all the resistors with a higher rank than R'i are short-circuited by the measuring line 5' and are no longer included in the calculation of the measured voltage V'mes. Consequently, the presence of the additional resistor R'n+1 does not influence the result of the measurement.

A priority order has thus also been defined between the pairs of contacts: when two or more pairs of contacts are closed at the same time, the measured voltage corresponds to the pair of closed contacts with the lowest rank, this pair of contacts hiding the state of any pair of contacts with a higher rank.

It can be seen that the priority order of the switches is the same, regardless of whether the pair of contacts in question is normally open or normally closed.

Therefore, by coupling two arrangements in a single encoding device, one with normally open contacts and the other with normally closed contacts, each pair of contacts being actuated by the same push-button, the same priority hierarchy of the push-buttons is maintained and the values of the voltage measured on each arrangement are staggered inversely with respect to each other.

Therefore, a redundant encoding device is obtained which allows the reliability of the transmitted information to be increased. Of course, it is likewise possible to form an encoding device having several arrangement combinations, e.g., two arrangements based on switches having two pairs of normally open contacts, three arrangements with switches with three pairs of contacts having two pairs of normally closed contacts and one pair of normally open contacts, or vice versa, etc.

As a variant, the measuring lines can be connected, as illustrated by the alternative measuring lines Vmes_alt and V'mes_alt in dashed lines in FIG. 2, to the downstream terminal of the resistor Rt (or R'1) directly connected to the voltage line. It is thus possible to obtain two voltage measurements for each arrangement in order to obtain redundancy for this measurement and to increase the reliability of the encoding device.

The encoding device described above can be usefully integrated into an operating lever of a helicopter joystick by associating it with a control device such as a flight control computer, without hindering the free movement of the ball joint of said joystick by a bundle of cables connecting the switches to the control device.

The invention can cover numerous variants and applications other than those described above. In particular, it goes without saying that, unless stated otherwise, the different structural and functional features of each of the embodiments described above do not have to be considered as being combined and/or closely and/or inextricably linked with each other, but in contrast considered as simple juxtapositions. Furthermore, the structural and/or functional features of the different embodiments described above can form, in their entirety or in part, any different juxtaposition or any different combination. For example, a device for encoding information in accordance with the invention can be applied to other operating devices such as a steering wheel of an automobile or a switch box of moving machines such as an agricultural tractor or an overhead crane or even remote handling equipment.

The invention claimed is:

1. Device for encoding information between a plurality of normally closed switches arranged on an operating lever and a control device, said device comprising:
    a voltage line connected to a positive terminal of a voltage source (Vcc),
    a reference line connected to ground of the voltage source,
    a measuring line connected to the control device,
    a plurality of switches connected in series to the voltage line, each switch being associated with a single resistor and connected by a first terminal to a first terminal of said resistor at a common point, named priority node, characterized in that:
    each priority node is arranged on the first terminal of the switch closest to the voltage line,
    each second terminal of the resistor is connected to the measuring line,
    the measuring line is connected to the reference line by an additional resistor, named bottom resistor.

2. The encoding device according to claim 1, wherein the switch furthest away from the voltage line is connected by a second terminal to the measuring line.

3. The encoding device according to any one of claim 1, wherein the priority node closest to the voltage line is connected thereto via an additional resistor, named top resistor.

4. The encoding device according to claim 3, wherein said device comprises an alternative measuring line connected to the priority node closest to the voltage line.

5. The encoding device according to claim 1, wherein said device is at least partially arranged within the operating lever.

6. The encoding device according to claim 5, wherein the bottom resistor directly connected to the reference line and the top resistor directly connected to the voltage line are arranged outside of the operating lever and allow proper operation of the encoding device to be verified.

7. The encoding device according to claim 1, wherein each switch comprises at least two pairs of contacts, a first, normally closed, pair and a second, normally open, pair.

8. The encoding device according to claim 7, wherein said device comprises at least one complementary arrangement comprising an array of resistors in series between a second voltage line and a plurality of pairs of normally open contacts, each pair of contacts comprising an upstream terminal and a downstream terminal, the upstream terminal of each pair of contacts being connected respectively to a connection point between two consecutive resistors and the downstream terminal being connected to a second measuring line.

9. The encoding device according to claim 8, wherein the complementary arrangement likewise comprises an alternative measuring line connected to a downstream terminal of a first resistor of said array of resistors, an upstream terminal of which is directly connected to the second voltage line.

10. The encoding device according to claim 8, wherein said device comprises an additional resistor connected between the upstream terminal of the pair of contacts with the highest rank and the measuring line.

11. Operating lever which is movable relative to a frame and connected to a control device, wherein said operating lever comprises an encoding device according to claim 1.

12. The operating lever according to claim 11, wherein said operating lever is part of a joystick of an aircraft.

* * * * *